(12) United States Patent
Sung et al.

(10) Patent No.: US 9,991,131 B1
(45) Date of Patent: Jun. 5, 2018

(54) DUAL MANDRELS TO ENABLE VARIABLE FIN PITCH

(71) Applicant: GLOBALFOUNDRIES INC., Grand Cayman (KY)

(72) Inventors: Min Gyu Sung, Latham, NY (US); Ruilong Xie, Schenectady, NY (US); Chanro Park, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/443,335

(22) Filed: Feb. 27, 2017

(51) Int. Cl.
*H01L 21/308* (2006.01)
*H01L 21/8234* (2006.01)

(52) U.S. Cl.
CPC ...... *H01L 21/3088* (2013.01); *H01L 21/3081* (2013.01); *H01L 21/3085* (2013.01); *H01L 21/3086* (2013.01); *H01L 21/823412* (2013.01); *H01L 21/823431* (2013.01)

(58) Field of Classification Search
CPC ............. H01L 21/3088; H01L 21/3081; H01L 21/3085; H01L 21/3086; H01L 21/823412; H01L 21/823431
See application file for complete search history.

(56) References Cited

U.S. PATENT DOCUMENTS

| | | | |
|---|---|---|---|
| 9,679,771 B1* | 6/2017 | Chen | H01L 21/0337 |
| 2015/0318181 A1* | 11/2015 | Cantone | H01L 21/823431 |
| | | | 438/702 |
| 2016/0093502 A1* | 3/2016 | Cheng | H01L 21/3086 |
| | | | 257/623 |
| 2016/0133726 A1 | 5/2016 | Sung et al. | |

* cited by examiner

*Primary Examiner* — Duy Vu N Deo
(74) *Attorney, Agent, or Firm* — Scully Scott Murphy and Presser; Frank DiGiglio

(57) ABSTRACT

A double masking process is used to form semiconductor fin arrays having a controlled and variable fin pitch within different arrays. During the process, a top mandrel layer overlies a bottom mandrel layer over a semiconductor substrate. Sidewall structures formed on first mandrels within a first region of the substrate define a patterned hard mask that cooperates with a patterned photoresist layer over a second region of the substrate to form second mandrels within first and second regions of the substrate. Sidewall structures formed on the second mandrels are used as a masking layer to form a plurality of fins over the substrate.

18 Claims, 8 Drawing Sheets

DUAL MANDRELS TO ENABLE VARIABLE FIN PITCH

BACKGROUND

The present application relates generally to semiconductor devices, and more particularly to fin field effect transistors (FinFETs) and their methods of fabrication.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

FinFETs can be incorporated into a variety of devices, including logic and memory platforms. In devices comprising different functionalities on the same chip, however, it may be desirable to form arrays of fins having distinct fin dimensions and/or intra-fin spacing. One approach for defining plural fins having variable spacing, or pitch, is to cut selected fins from an initial array of fins. As will be appreciated, however, the achievable fin-to-fin spacing with such an approach is limited.

Defining a variable and controllable pitch between fins in situ has been problematic due to an inadequate lithography processing window resulting in, for example, line-width variability and/or line roughness.

SUMMARY

Disclosed is a dual mandrel process for defining distinct fin arrays having a locally-defined fin pitch. According to various embodiments, the fin pitch within each array can be configured for disparate functionalities such as logic and/or memory applications. Fins within first and second regions of a semiconductor substrate can be defined by a sidewall image transfer (SIT) technique using respective first and second sets of mandrels. The first set of mandrels can be defined using a first patterning scheme, while the second set of mandrels can be defined using a second patterning scheme. In certain embodiments, a subset of the second set of mandrels are defined using the first set of mandrels.

In accordance with embodiments of the present application, a method of forming a semiconductor structure includes forming a bottom mandrel layer over a semiconductor substrate and forming a top mandrel layer over the bottom mandrel layer. The top mandrel layer is etched to form a plurality of top sacrificial mandrels within a first region of the substrate, and top spacer layers are formed on sidewalls of the top sacrificial mandrels. In certain embodiments, the top sacrificial mandrels are removed from within the first region of the substrate and remaining portions of the top mandrel layer are removed from within a second region of the substrate.

The method further includes transferring a pattern corresponding to the top spacer layers into the bottom mandrel layer to form a plurality to bottom sacrificial mandrels within the first region of the substrate, and etching the bottom mandrel layer to form a plurality of bottom sacrificial mandrels with the second region of the substrate. The formation of bottom sacrificial mandrels with the first and second regions of the substrate may be performed simultaneously.

Bottom spacer layers are then formed on sidewalls of the bottom sacrificial mandrels within the first and second regions of the substrate, and a pattern corresponding to the bottom spacer layers is transferred into the substrate to form a plurality of semiconductor fins.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
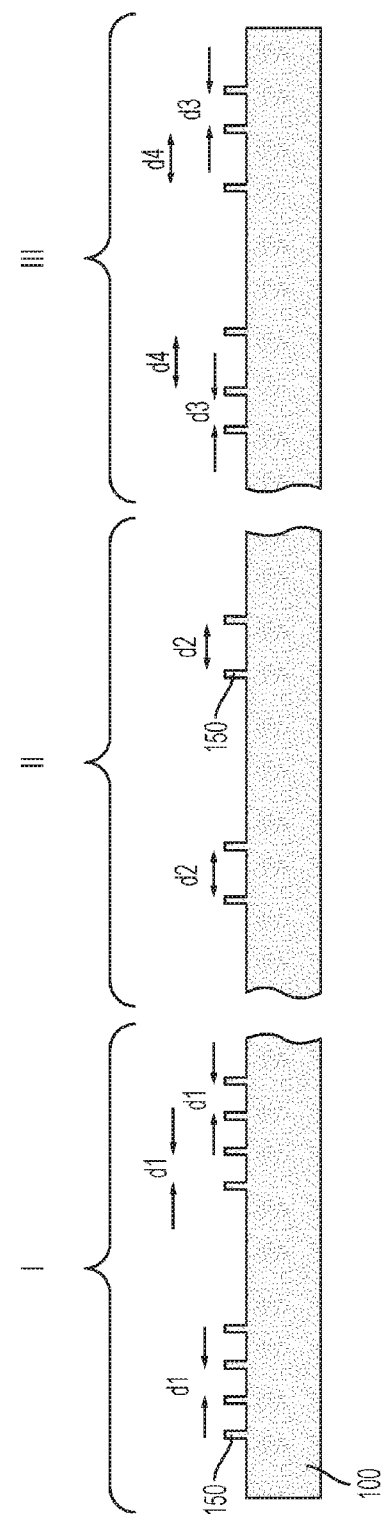
FIG. 1 is a schematic cross-sectional diagram showing arrays of semiconductor fins on a semiconductor substrate formed with a distinct intra-fin spacing within different regions of the substrate.

Reference will now be made in greater detail to various embodiments of the subject matter of the present application, some embodiments of which are illustrated in the accompanying drawings. The same reference numerals will be used throughout the drawings to refer to the same or similar parts.

Disclosed are semiconductor structures and their methods of manufacture and, more particularly, a double masking process for forming semiconductor fin arrays having a controlled and variable fin pitch within a given array.

With reference to FIG. 1, a semiconductor structure at an intermediate stage of fabrication includes a semiconductor substrate 100 having a plurality of semiconductor fins 150 formed thereon. Within a first region (I) of the substrate, fins 150 are configured in arrays having an intra-fin spacing, or pitch, d1. Although the illustrated embodiment depicts two arrays, each comprising four fins 150, the number of arrays and the number of fins per array may be selected for a particular function or application. For instance, first region (I) may be adapted for logic functionality.

Within a second region (II) of the substrate, fins 150 are configured in arrays having a pitch, d2. Although for simplicity the illustrated embodiment depicts only two arrays, each comprising two fins, the number of arrays and the number of fins per array within the second region (II) may be selected for a particular function or application. For instance, second region (II) may be adapted for a first type of memory (e.g., an SRAM cell having a single pull-up device, a single pull-down device, and a single pass gate device).

Within a third region (III) of the substrate, according to various embodiments, fins 150 are configured in arrays defined by more than a single pitch. Referring to the third region (III) of FIG. 1, a first fin is separated from a second fin by a distance d3, while the second fin is separated from a third fin by a distance, d4. Although the illustrated embodiment depicts two arrays, each comprising three fins, the number of fins and the intra-fin spacing(s) may be selected for a particular function or application. For instance, third region (III) may be adapted for a second type of memory (e.g., an SRAM cell having a single pull-up device, a pair of pull-down devices, and a pair of pass gate devices). Thus, in various embodiments, the present method enables the formation of two or more distinct devices (e.g., logic and memory devices) on the same chip.

As used herein, the term "pitch" refers to the distance between one structure or feature (e.g., a first fin or a first mandrel) and an adjacent structure or feature (e.g., a second fin or a second mandrel). The pitch (d1, d2, d3, d4) within any region (I, II, III) of the substrate may be independently defined within a range of 20 to 100 nm, e.g., 20, 30, 40, 50, 60, 70, 80, 90 or 100 nm, including ranges between any of the foregoing values, although smaller and larger pitch values are contemplated. In exemplary embodiments, d1≤d2≤d3≤d4. In further exemplary embodiments, d1≤d3≤d2≤d4 or d1≤d3≤d4≤d2. In still further embodiments, d1≤d4≤d2≤d3 or d1≤d4≤d3≤d2.

The terms "line-width" or "width" refers to a lateral dimension of a structure or feature (e.g., the distance between opposing sidewalls of a fin or mandrel). Example fins have a width of 5 to 20 nm, e.g., 5, 10, 15 or 20 nm, including ranges between any of the foregoing values. An "array" of fins may include any integral number of fins, N, where N≥2.

Referring still to FIG. 1, substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In various embodiments, fins 150 comprise a semiconductor material such as silicon, and may be formed by patterning and then etching the semiconductor substrate 100, i.e., a top portion of the semiconductor substrate. In several embodiments, the fins 150 are etched from, and therefore contiguous with the semiconductor substrate 100.

Reference will now be made to FIGS. 2-15, which together with the following description, provide an exemplary method for manufacturing plural fins (e.g., plural fin arrays) within different regions of a semiconductor substrate 100 where the fin pitch (d) is locally controlled within each region as depicted, for example, in FIG. 1.

Figure 2:
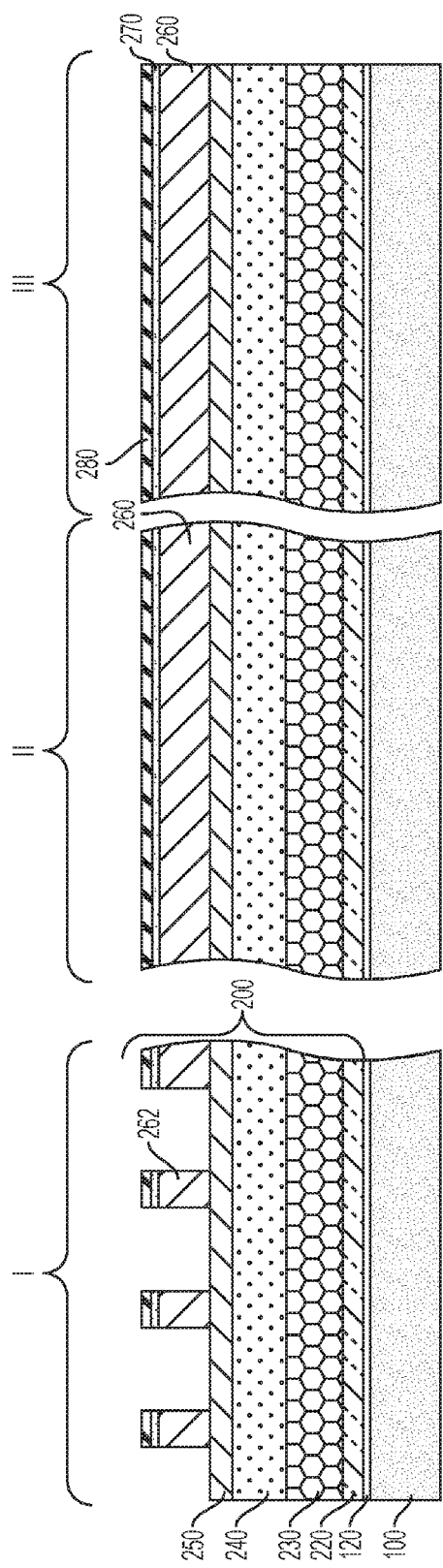
FIG. 2 is a cross-sectional schematic diagram showing a patterning architecture disposed over a semiconductor substrate and the patterning of a mask layer to define a top set of mandrels within a first region of the substrate.

Referring to FIG. 2, disposed over semiconductor substrate 100 is a patterning architecture 200 comprising plural layers that may be formed one over the other in succession. In the illustrated embodiment, patterning architecture 200 comprises, from bottom to top, bottom hard mask 220, bottom mandrel layer 230, top mandrel layer 240, etch stop layer 250, organic planarization layer 260, silicon-containing anti-reflective coating (SiARC) 270, and photoresist layer 280.

According to various embodiments, the formation or deposition of a layer or structure, including the foregoing layers, may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

Referring still to FIG. 2, a pad oxide layer 120 is formed directly over semiconductor substrate 100, and may comprise an oxide layer such as a layer of silicon dioxide. Pad oxide 120 may be plasma-deposited or thermally deposited from a precursor suite comprising a silicon source such as tetraethylorthosilicate (TEOS) and an oxygen source such as oxygen gas or ozone. Pad oxide 120 may be spun-on using TEOS as a precursor. A thickness of pad oxide 120 may range from 3 to 10 nm, e.g., 3, 5 or 10 nm, including ranges between any of the foregoing values, although greater and lesser thicknesses are contemplated. Disposed over pad oxide 120 is the patterning architecture 200. Pad oxide 120 may serve as a buffer layer between the semiconductor substrate 100 and overlying hard mask 220.

In the illustrated embodiment, a bottom hard mask 220, such as a nitride hard mask layer, directly overlies the pad oxide layer 120. An example hard mask 220 comprises silicon nitride, and may have a thickness of 20 to 50 nm, e.g., 20, 25, 30, 35, 40, 45 or 50 nm, including ranges between any of the foregoing values. The bottom hard mask 220 is adapted to serve as an etch stop layer during subsequent processing. As used herein, a "hard mask" comprises an inorganic material.

A bottom mandrel layer 230 is formed over the bottom hard mask 220. The bottom mandrel layer 230 may comprise amorphous silicon (a-Si), for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition. The bottom mandrel layer 230 may have a thickness of 50 to 150 nm, e.g., 50, 75, 100, 125 or 150 nm, including ranges between any of the foregoing values, although greater and lesser thicknesses may be used. As will be described in further detail below, bottom mandrel layer 230 is adapted to be patterned and provide a sacrificial mandrel for the fin patterning process described herein.

A top mandrel layer 240, such as a layer of amorphous carbon (a-C), is formed over the bottom mandrel layer 230 and is adapted to be patterned and provide a sacrificial mandrel for the fin patterning process described herein. An amorphous carbon layer may be formed from a gas mixture comprising a hydrocarbon source and a diluent gas at a deposition temperature of 200° C. to 700° C., for example.

Exemplary hydrocarbon compounds that may be included in the hydrocarbon source used to form the amorphous carbon layer 240 may be described by the formula $C_xH_y$, where $1 \leq x \leq 10$ and $2 \leq y \leq 30$. Such hydrocarbon compounds may include, but are not limited to alkanes such as methane, ethane, propane, butane and its isomer isobutane, pentane and its isomers isopentane and neopentane, hexane and its isomers 2-methylpentane, 3-methylpentane, 2,3-dimethylbutane, 2,2-dimethyl butane, and the like; alkenes such as ethylene, propylene, butylene and its isomers, pentene and its isomers, and the like; dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like; and alkynes such as acetylene, propyne, butyne, vinylacetylene and derivatives thereof. Further hydrocarbon compounds include aromatic molecules such as benzene, styrene, toluene, xylene, ethylbenzene, acetophenone, methyl benzoate, phenyl acetate, phenol, cresol, furan, and the like, as well as halogenated aromatic compounds including monofluorobenzene, difluorobenzenes, tetrafluorobenzenes, hexafluorobenzenes and the like.

Suitable diluent gases may include, but are not limited to, hydrogen ($H_2$), helium (He), argon (Ar), ammonia ($NH_3$), carbon monoxide (CO), carbon dioxide ($CO_2$), and mixtures thereof.

The top mandrel layer 240 may have a thickness of 50 to 150 nm, e.g., 50, 75, 100, 125 or 150 nm, including ranges between any of the foregoing values, although greater and lesser thicknesses may be used. Optionally, an as-deposited amorphous carbon (a-C) layer may be cured such as by exposure to UV radiation at a curing temperature greater than 200° C. In various embodiments, the amorphous carbon layer comprises a soft etching mask. As used herein, a "soft mask" comprises polymeric or other organic materials.

As will be appreciated, in specific embodiments, the amorphous silicon layer and the amorphous carbon layer may be conventionally patterned during various stages of the presently-disclosed method to form mandrels. After patterning, sidewall spacers are formed on opposing sides of the mandrels. The mandrels can then be removed, leaving the pair of sidewall spacers. The sidewalls spacers, in turn, can be used to pattern an underlying layer.

Formed over the amorphous carbon layer 240 is a layer of low temperature oxide (LTO) 250, i.e., a layer of silicon dioxide. The low temperature oxide may be deposited at a temperature that is compatible with the underlying layer of amorphous carbon. For instance, the LTO layer 250 may be deposited at a temperature of less than 300° C. In various embodiments, the low temperature oxide functions as an etch stop layer between the amorphous carbon layer 240 and an overlying organic planarization layer (OPL) 260.

An optical mask layer, such as an organic planarization layer (OPL) 260 is disposed over the LTO layer 250. The organic planarization layer may be formed by a spin-coating process and thereafter dried. By way of example, the OPL 260 may comprise a spin-on-carbon material. The thickness of the OPL 260 may range from 100-900 nm, although greater and lesser thicknesses may be used.

A silicon-containing anti-reflective coating (SiARC) layer 270 overlies the organic planarization layer 260. The SiARC layer may include cross-linked, silicon-containing polymers. Exemplary SiARC layers may have a silicon-content of 15-45%. The SiARC layer 270, because of its silicon content, can be used as a hard mask having high etch selectivity to a photoresist layer 280 or other soft mask.

Overlying the SiARC layer is a photoresist layer 280. The photoresist may include a positive-tone photoresist composition, a negative-tone photoresist composition, or a hybrid-tone photoresist composition. The layer of photoresist material may be formed by a deposition process such as, for example, spin-on coating.

Referring to first region (I) of FIG. 2, etching of the OPL layer 260 to form a patterned mask 262 may be achieved using any conventional lithography and etching process. According to various embodiments, the deposited photoresist layer 280 is subjected to a pattern of irradiation, and the exposed photoresist material is developed utilizing a conventional resist developer. In the instant embodiment, this provides a patterned layer of photoresist within first region (I). The pattern provided by the patterned photoresist material is thereafter transferred into the ARC and OPL layers, utilizing at least one pattern transfer etching process, and the photoresist and ARC layers are removed The pattern transfer etching process is typically an anisotropic etch. In certain embodiments, a dry etching process such as, for example, reactive ion etching can be used. In other embodiments, a wet chemical etchant can be used. In still further embodiments, a combination of dry etching and wet etching can be used. The LTO layer 250 may serve as an etch stop layer during patterning of the OPL layer 260.

Figure 3:
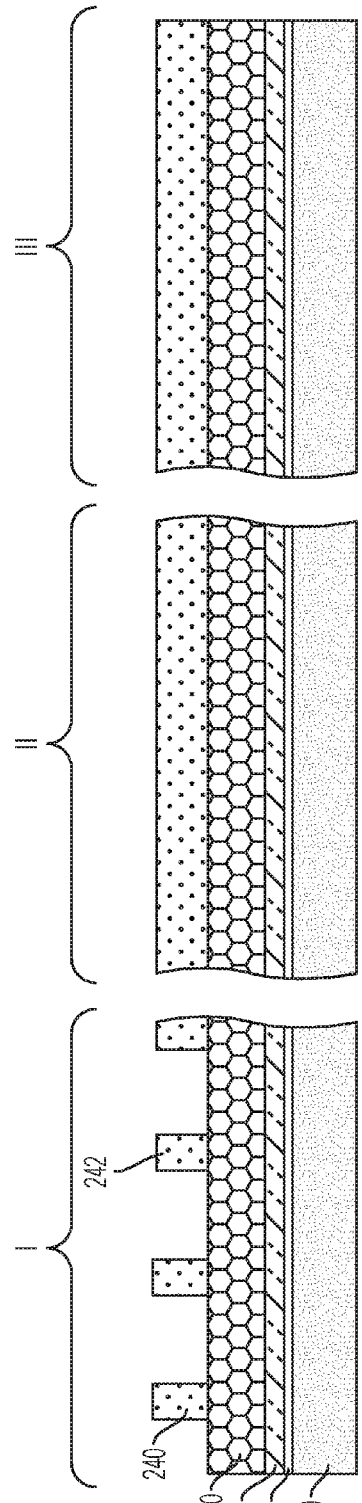
FIG. 3 shows reactive ion etching to form the top set of mandrels from an amorphous carbon layer within the first region of the substrate.

Referring to FIG. 3, using the patterned mask 262 as an etch mask, a further etching step is used to etch through the LTO layer 250 and transfer the overlying pattern into the top mandrel (e.g., amorphous carbon) layer 240 to form a plurality of top mandrels 242. The photolithography stack comprising the photoresist 280, SiARC 270 and OPL 260 is removed along with the LTO layer 250. Top mandrels 242 may be formed within first region (I) to the exclusion of the second region (II) and the third region (III). That is, according to various embodiments, the top mandrel layer 240 remains un-patterned with the second and third regions (II, III) of the semiconductor substrate.

Figure 4:
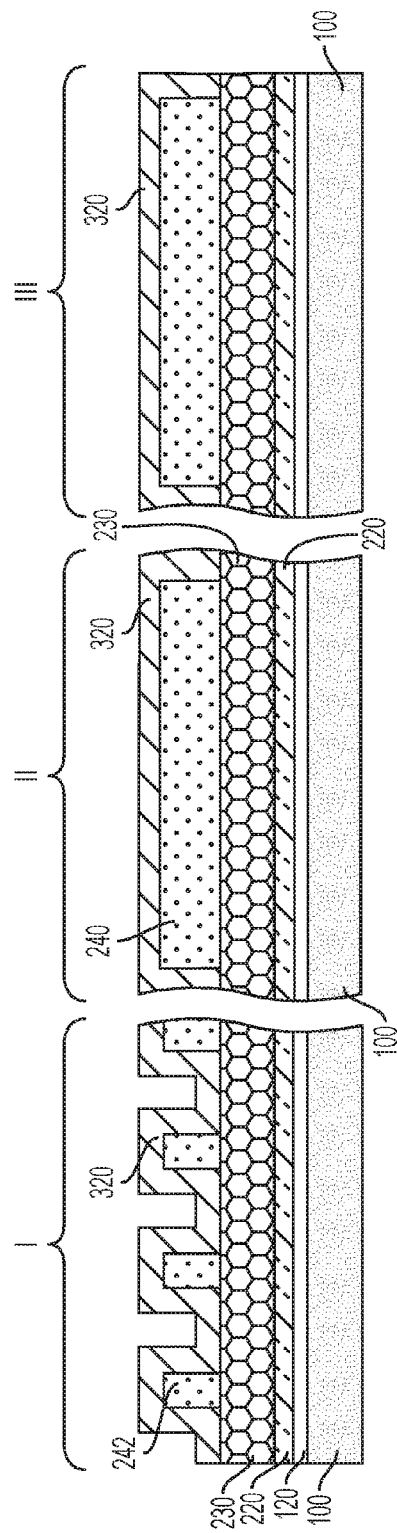
FIG. 4 shows the conformal deposition of a top spacer layer over the top set of mandrels.

Thereafter, referring to FIG. 4, a top spacer layer 320 is formed over the top mandrels 242 within first region (1) and over the top of the un-patterned top mandrel layer 240 within the second region (H) and the third region (III). In various embodiments, formation of the top spacer layer 320 includes a conformal deposition process such as a chemical vapor deposition (CVD) process. The thickness of the top spacer 320 may range from 20 to 50 nm, e.g., 20, 30, 40 or 50 nm, including ranges between any of the foregoing values.

The top spacer 320 may comprise, for example, silicon dioxide ($SiO_2$). Alternatively, top spacer 320 may comprise other dielectric materials such as silicon nitride, silicon oxynitride, a low-k material, or any suitable combination of these materials. Exemplary low-k materials include but are not limited to, amorphous carbon, fluorine-doped oxides, carbon-doped oxides, SiCOH or SiBCN. Commercially-available low-k dielectric products and materials include Dow Corning's SiLK™ and porous SiLK™, Applied Materials' Black Diamond™. Texas Instrument's Coral™ and TSMC's Black Diamond™ and Coral™. As used herein, a low-k material has a dielectric constant less than that of silicon dioxide.

Figure 5:
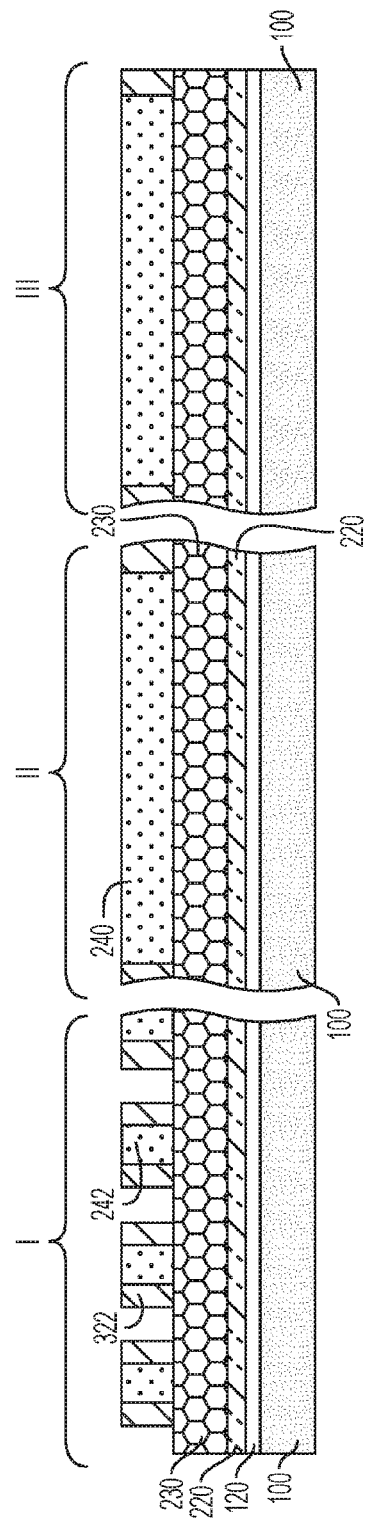
FIG. 5 depicts the anisotropic etch back of the top spacer layer.

Formation of the top spacer layer 320 is followed by an anisotropic etch, such as a reactive ion etch, to remove the spacer material(s) from horizontal surfaces, which exposes top surfaces of the top mandrels 242 and the bottom mandrel layer 230 within the first region (I), and exposes top surfaces of the un-patterned top mandrel layer 240 within the second region (11) and third region (III), as illustrated in FIG. 5. After the anisotropic etch, a thin structure of the top spacer layer 320 remains on the sidewalls of each of the top mandrels 242.

Figure 6:
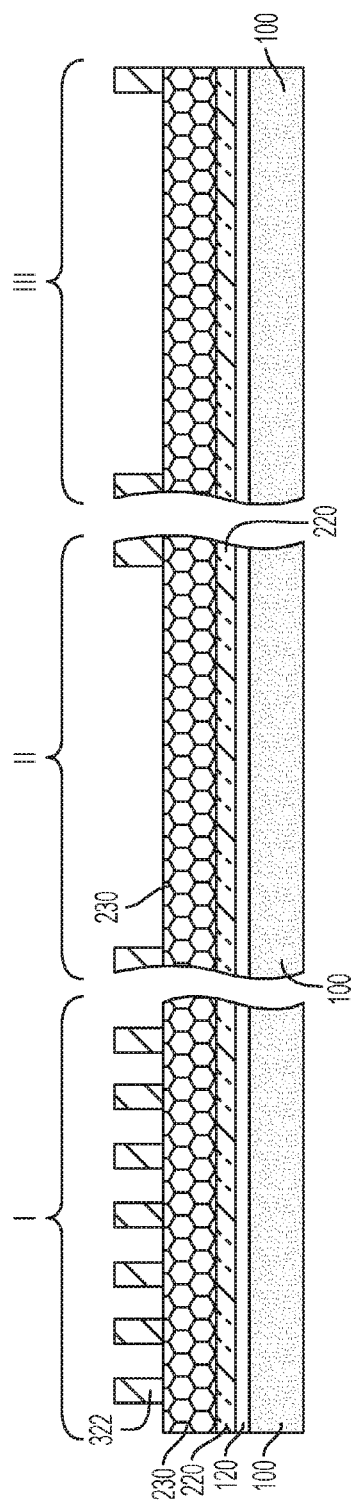
FIG. 6 shows removal of the amorphous carbon layer, including the top set of mandrels.

Referring to FIG. 6, remaining portions of the amorphous carbon layer 240, including the top set of mandrels 242 within the first region (I), are then removed with selectivity to the top spacer layer material and the bottom mandrel layer 230 to define a top etch mask 322 comprising remaining portions of the top spacer layer. The top etch mask 322 is used to pattern the bottom mandrel layer 230 within the first region (I). Removal of the amorphous carbon can be achieved, for example, using conventional etch methods such as an isotropic wet etch process. The top etch mask 322 may include structures having a width of 20 to 50 nm, e.g., 20, 30, 40 or 50 nm, arranged at a pitch of 50 to 150 nm, e.g., 50, 100 or 150 nm including ranges between any of the foregoing values.

Figure 7:
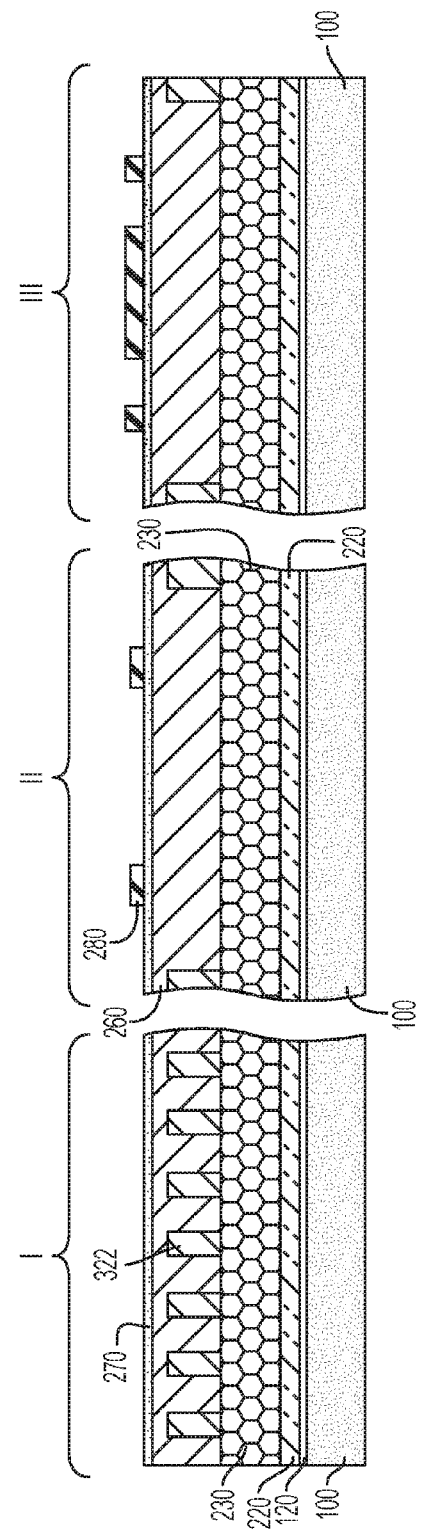
FIG. 7 shows formation of a photolithography stack and the patterning of a photoresist layer to define a bottom set of mandrels within second and third regions of the substrate.

Referring to FIG. 7, a photolithography stack comprising, from bottom to top, an organic planarization layer (OPL) 260, a silicon-containing anti-reflective coating (SiARC) layer 270, and a photoresist layer 280, is formed over the structure of FIG. 6. In the illustrated embodiment, the organic planarization layer (OPL) 260 is formed directly over a top surface of the bottom mandrel layer 230.

Within second and third regions (11, III) of the substrate, the photoresist layer 280 is patterned using conventional lithography techniques to form a patterned mask for defining a bottom set of mandrels. In a manner as described above, the photoresist pattern is transferred to the ARC and OPL layers, and the photoresist and ARC layers are removed. Thus, in some embodiments, the remaining OPL within the second and third regions (11, III) may form a patterned mask layer (not shown). The OPL 260 may be patterned within the second region (11) and the third region (III) to the exclusion of the first region (I).

Figure 8:
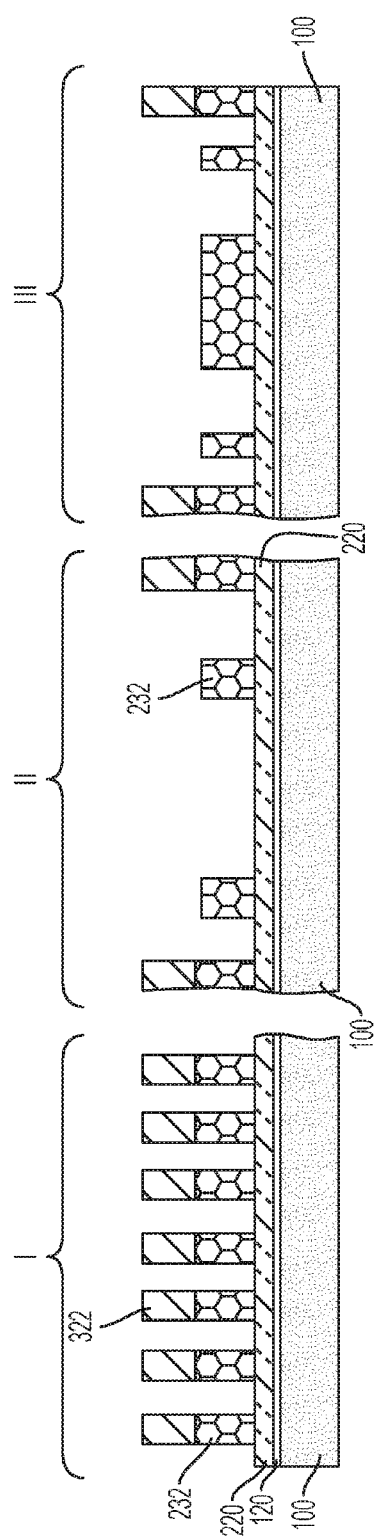
FIG. 8 shows reactive ion etching to form the bottom set of mandrels from an amorphous silicon layer within the first, second and third regions of the substrate.

Referring to FIG. 8, an etching step, such as a reactive ion etching step, is used to define bottom mandrels 232 from amorphous silicon layer 230 within the first, second and third regions of the substrate. The patterning of the Si material can be achieved using any conventional lithography and etching (reactive ion etching) processes, known to accomplish such patterning techniques.

Figure 9:
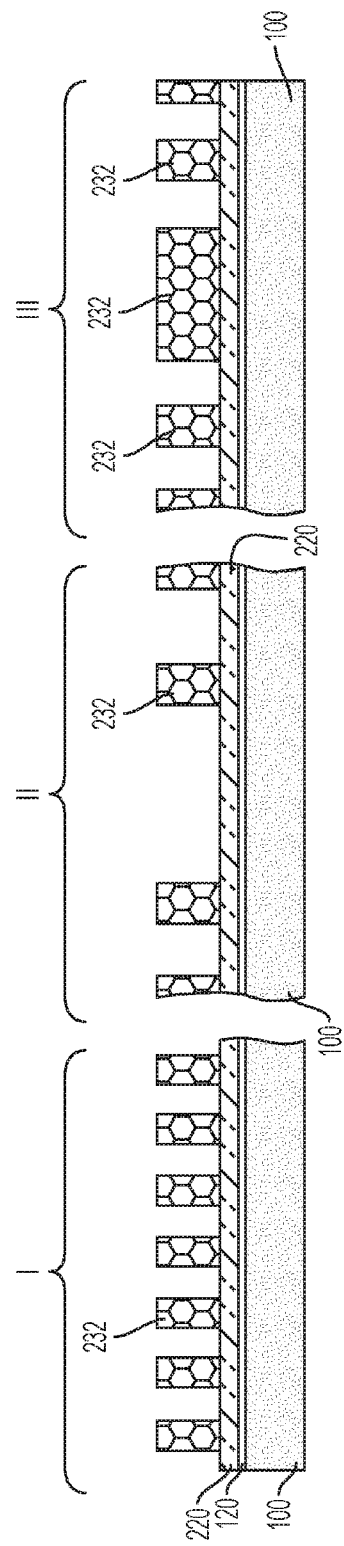
FIG. 9 shows the removal of remaining portions of the top spacer layer from over the bottom set of mandrels.

Within the first region (I) of the semiconductor substrate, the pattern provided by the top etch mask 322 is transferred into the bottom mandrel layer 230 to form bottom mandrels 232 within the first region (I), while within the second region (II) and the third region (III), the pattern provided by the photoresist layer 280 (and thereafter patterned OPL layer 260) is transferred into the bottom mandrel layer 230 to form bottom mandrels 232 within the second region (I) and the third region (Ill). Referring to FIG. 9, the top etch mask 322 and overlying layers are then removed from over the bottom set of mandrels. For example, remaining top etch mask 322 may be stripped using a wet etch.

Figure 10:
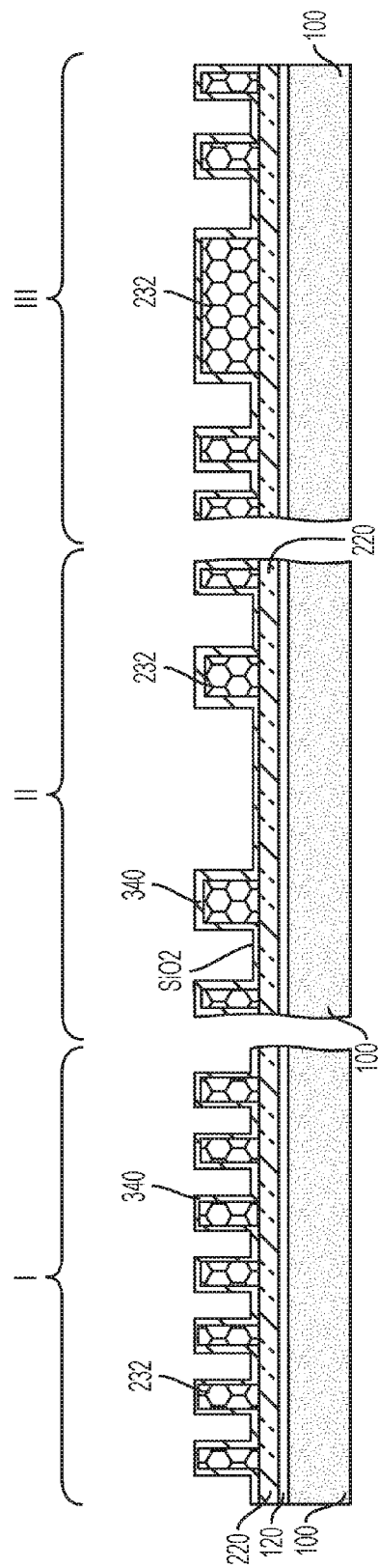
FIG. 10 shows the conformal deposition of a bottom spacer layer over the bottom set of mandrels.

FIG. 10 shows the conformal deposition of a bottom spacer layer 340 over the bottom set of mandrels 232. The processes and materials used to form the bottom spacer layer 340 may be the same as those used to form the top spacer layer 320 described above. In certain embodiments, the thickness of the bottom spacer layer 340 may range from 5 to 20 nm, e.g., 5, 10, 15 or 20 nm, including ranges between any of the foregoing values. In certain embodiments, the thickness of the bottom spacer layer 340 is less than the thickness of the top spacer layer 320.

Figure 11:
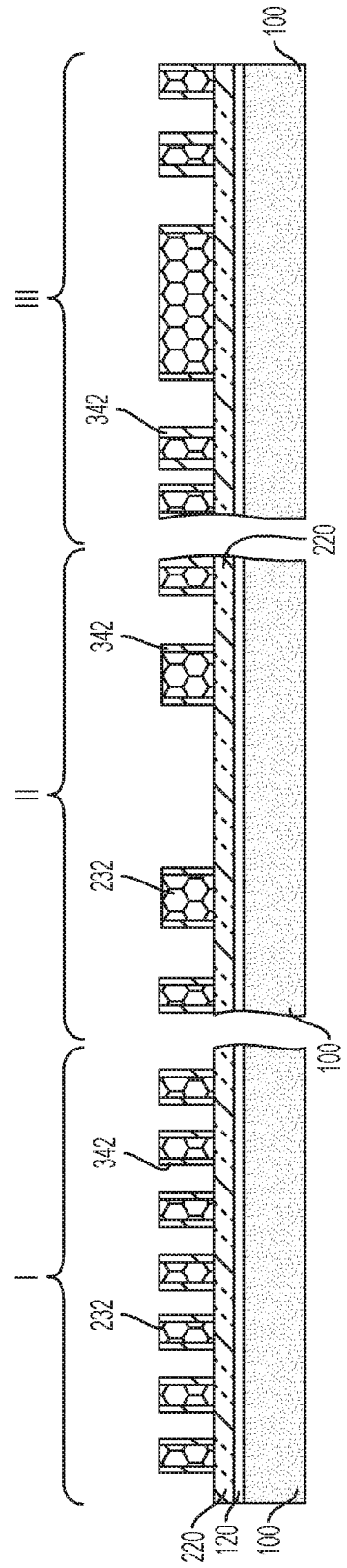
FIG. 11 depicts the structure of FIG. 10 following the anisotropic etch back of the bottom spacer layer.

Referring to FIG. 11, formation of the bottom spacer layer 340 is followed by an anisotropic etch to remove the spacer layer from horizontal surfaces. The etch back of the bottom spacer layer exposes top surfaces of the bottom mandrels 232 and the bottom hard mask 220, which may function as an etch stop layer during the etch back. After the anisotropic etch, a thin structure of the bottom spacer layer remains on the sidewalls of each of the bottom mandrels 232. In the illustrated embodiment, the thin structures of the bottom spacer layer that remain on the sidewalls of the bottom mandrels are formed simultaneously in each of regions I, II and III.

Figure 12:
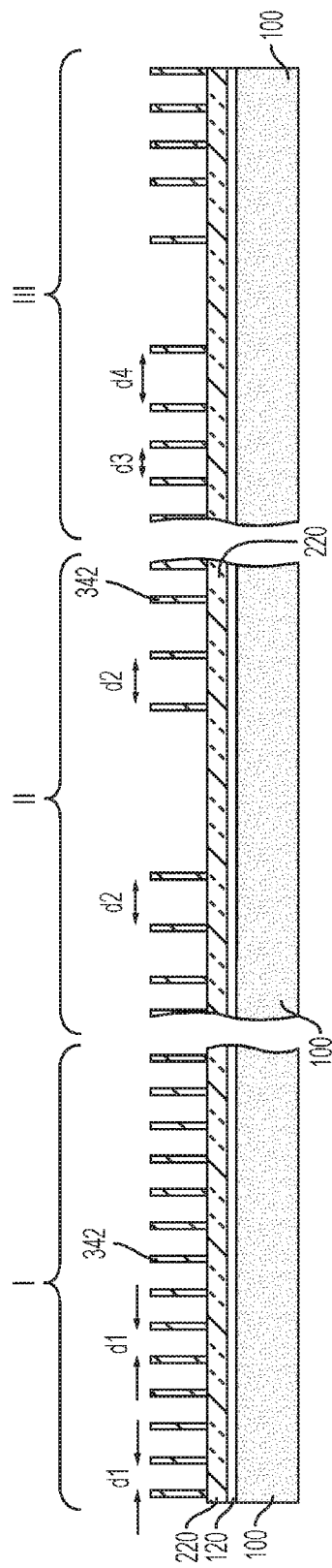
FIG. 12 shows the selective removal of the bottom set of mandrels.

Referring to FIG. 12, remaining portions of the amorphous silicon layer 230, i.e., the bottom set of mandrels 232, are removed with selectivity to the sidewall structures 342 and the bottom hard mask 220 to define a bottom etch mask comprising the sidewall structures 342. The sidewall structures, in turn, can be used to pattern the fins 150 within first, second and third regions of the substrate.

In various embodiments, sidewall structures 342 within a first region (I) of the semiconductor substrate, such as a logic region, are arranged at a regular pitch d1. Sidewall structures 342 within a second region (II) of the semiconductor substrate, such as a first memory region, are arranged at a regular pitch d2. Sidewall structures 342 within a third region (III) of the semiconductor substrate, such as a second memory region, are arranged at an irregular pitch.

Figure 13:
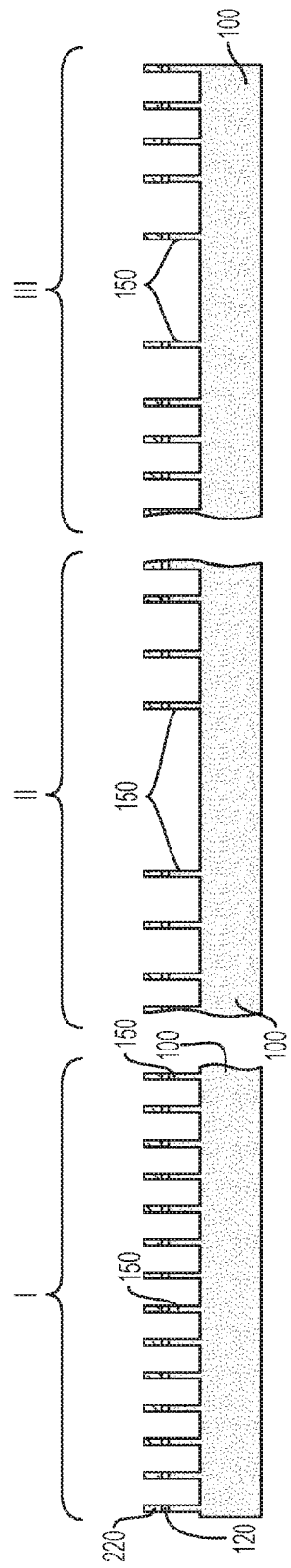
FIG. 13 depicts an intermediate architecture following etching of the semiconductor substrate to define a plurality of fins in the first, second and third regions of the substrate using remaining portions of the bottom spacer layer as an etch mask.

FIG. 13 depicts an intermediate architecture following etching of the bottom hard mask 220, pad oxide 120, and semiconductor substrate 100 to define a plurality of fins 150 in the first, second and third regions of the substrate, as defined by the bottom etch mask 342. In various embodiments, the fins 150 can have a width of 5 nm to 20 nm, a height of 40 nm to 150 nm, and a pitch (d1-d4) of 20 nm to 100 nm, although other dimensions are also contemplated.

Figure 14:
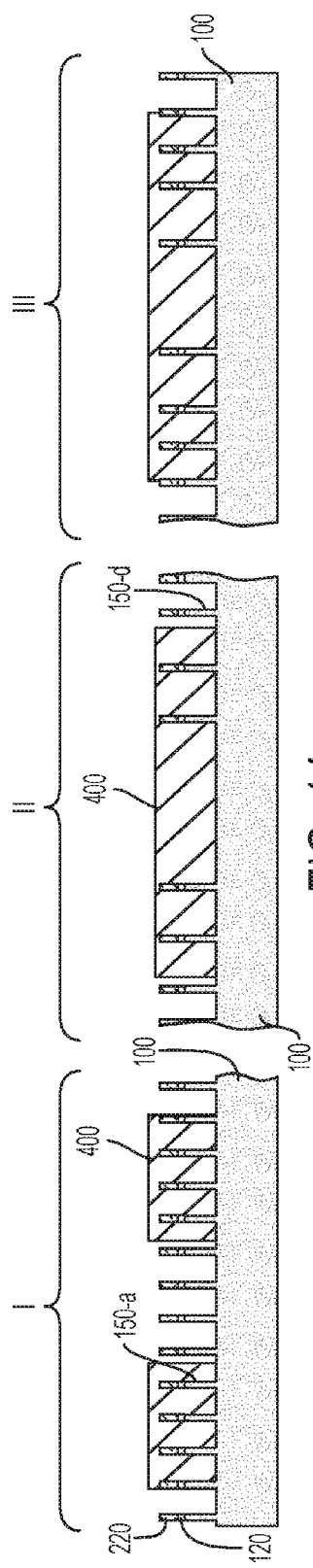
FIG. 14 shows the formation of a block mask over selected fins within the first, second and third regions.

Referring to FIG. 14, the fins 150 include active fins 150-*a* and dummy fins 150-*d*. The dummy fins 150-*d* are not functional, but their formation improves the reproducibility of the manufacturing process. At this stage of manufacture, the pad oxide 120 and bottom hard mask 220 may overlie fins 150. According to various embodiments, the active fins 150-*a* are defined using plural patterning and etching processes employing a pair of mandrel layers that are patterned in succession to form top and bottom sets of mandrels.

After fin formation, a fin cut or fin removal process may be used to remove unwanted fins (e.g., dummy fins) or portions thereof from the particular circuit or device being fabricated. According to certain embodiments, a layer of photoresist is formed over the active and dummy fins and patterned using conventional lithography to form a block mask 400 that covers the active fins 150-*a* within the first, second and third regions. Then, referring to FIG. 15, the exposed dummy fins 150-*d* are removed using a suitable etching process. For instance, the unwanted fin structure(s), may be removed using a selective wet-etch, such as a KOH or TMAH-based anisotropic etch, or a selective dry etch. An example dry etch includes an $HBr/Cl_2/O_2$ chemistry in a microwave or remote plasma system.

Figure 15:
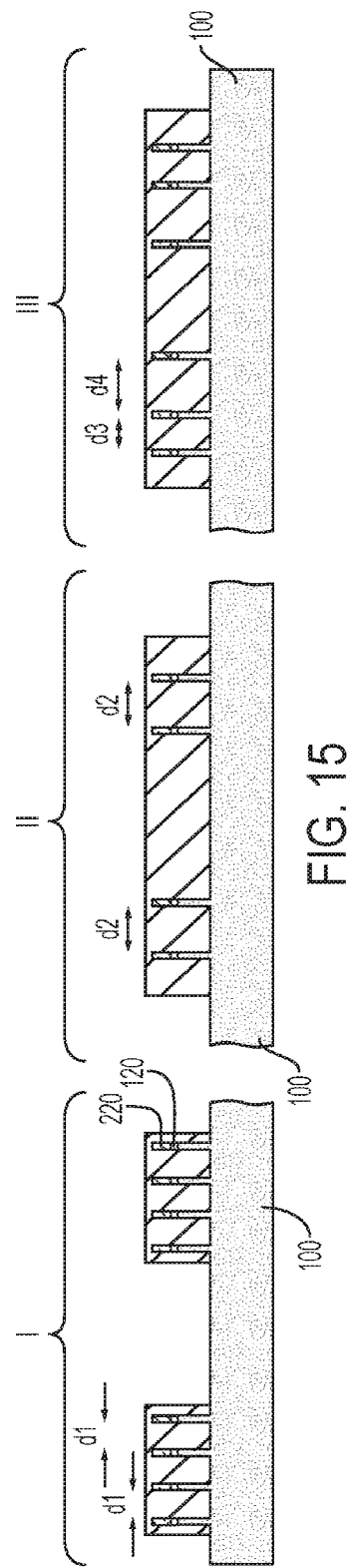
FIG. 15 shows plural fin arrays formed over the semiconductor substrate after removing unprotected fins and prior to removal of the block mask.

FIG. 15 shows plural fin arrays each array having a controlled and distinct intra-fin spacing formed over the semiconductor substrate after removing the unprotected dummy fins 150-*d*. By way of example, active fins 150-*a* within a first region (I) of the substrate, such as a logic region, are arranged at a regular pitch d1. Active fins 150-*a* within a second region (II) of the substrate, such as a first memory region, are arranged at a regular pitch d2, while active fins 150-*a* within a third region (III) of the substrate, such as a second memory region, are arranged at an irregular pitch.

After etching the dummy fins, the patterned photoresist layer, the pad oxide 120 and the bottom hard mask 220 layers are removed by additional processing, which may be a dry etch, wet etch, or a combination thereof. The resulting structure is shown in FIG. 1.

The methods and structures disclosed herein, which includes separate patterning of logic- and memory-dedicated fin arrays, may be used when manufacturing devices having any number of fins. The disclosed method may be used to co-integrate memory and logic devices on a single chip. Further processing steps may be performed to complete the device fabrication, such as forming gate electrodes, doping source and drain regions, forming contacts, etc.

The method as described herein may be used in the fabrication of integrated circuit (IC) chips. The integrated circuit chips may be distributed by the fabricator in raw wafer form (that is, as a single wafer that has multiple unpackaged chips), as a bare die, or in a packaged form. In the latter case, the chip is typically mounted in a single-chip package such as a plastic carrier, with leads that are affixed to a motherboard or other higher-level carrier, or in a multichip package such as a ceramic carrier. The chip can be integrated with other chips, discrete circuit elements, and/or other signal processing devices as part of an intermediate product such as a motherboard, or a consumer-facing product. The consumer-facing product can be any product that includes integrated circuit chips, ranging from toys and other low-end applications to handheld electronics such as telephones, to advanced computer products having a central processor, a display, a keyboard or other input/output (I/O) device.

As used herein, the singular forms "a," "an" and "the" include plural referents unless the context clearly dictates otherwise. Thus, for example, reference to a fin array having a "pitch" includes arrays having two or more "pitches" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a fin that comprises silicon include embodiments where the fin consists essentially of silicon and embodiments where the fin consists of silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:

forming a bottom mandrel layer over a semiconductor substrate;

forming a top mandrel layer over the bottom mandrel layer;

etching the top mandrel layer to form a plurality of top sacrificial mandrels within a first region of the substrate while masking the top mandrel layer within a second region of the substrate;

forming a top etch mask on sidewalls of the top sacrificial mandrels;

removing the top sacrificial mandrels from the first region of the substrate;

removing the top mandrel layer from the second region of the substrate;

patterning a masking layer over the bottom mandrel layer within the second region of the substrate;

transferring a pattern corresponding to the top etch mask into the bottom mandrel layer to form a plurality to bottom sacrificial mandrels within the first region of the substrate;

transferring a pattern corresponding to the masking layer into the bottom mandrel layer to form a plurality of bottom sacrificial mandrels with the second region of the substrate;

forming a bottom etch mask on sidewalls of the bottom sacrificial mandrels within the first and second regions of the substrate; and transferring a pattern corresponding to the bottom etch mask into the substrate to form a plurality of semiconductor fins.

2. The method of claim 1, wherein the top mandrel layer is formed directly over the bottom mandrel layer.

3. The method of claim 1, wherein the top mandrel layer comprises amorphous carbon and the bottom mandrel layer comprises amorphous silicon.

4. The method of claim 1, wherein prior to etching the top mandrel layer, a first photolithography stack comprising, from bottom to top, an organic planarization layer, an antireflection coating, and a photoresist layer, is formed over the top mandrel layer.

5. The method of claim 4, further comprising forming a low temperature oxide layer over the top mandrel layer prior to forming the first photolithography stack.

6. The method of claim 1, wherein transferring the pattern corresponding to the top etch mask into the bottom mandrel layer within the first region of the substrate and transferring the pattern corresponding to the masking layer into the bottom mandrel layer within the second region of the substrate are performed simultaneously.

7. The method of claim 1, wherein the masking layer comprises, from bottom to top, an organic planarization layer, an antireflection coating, and a photoresist layer.

8. The method of claim 1, wherein the plurality of top sacrificial mandrels are spaced apart from one another by a first distance along a first direction, the plurality of bottom sacrificial mandrels are spaced apart from one another by a second distance along the first direction, and the first distance is different from the second distance.

9. The method of claim 1, wherein forming the top etch mask comprises conformally depositing a top dielectric layer and anisotropically etching the top dielectric layer.

10. The method of claim 1, wherein the top etch mask has a thickness of 20 to 50 nm.

11. The method of claim 1, wherein forming the bottom etch mask comprises conformally depositing a bottom dielectric layer and anisotropically etching the bottom dielectric layer.

12. The method of claim 1, wherein the bottom etch mask has a thickness of 5 to 20 nm.

13. The method of claim 1, wherein a thickness of the bottom etch mask is less than a thickness of the top etch mask.

14. The method of claim 1, wherein the fins within the first region of the substrate are arrayed at a first pitch and the fins within the second region of the substrate are arrayed at a second pitch different from the first pitch.

15. The method of claim 1, wherein the fins within the first region of the substrate are arrayed at a first pitch and the fins within the second region of the substrate are arrayed at a second pitch different from the first pitch prior to removing any fins.

16. The method of claim 1, further comprising forming a nitride hard mask over the substrate prior to forming the bottom mandrel layer.

17. The method of claim 1, further comprising:

etching the bottom mandrel layer to form a plurality of bottom sacrificial mandrels with a third region of the substrate;

forming a bottom etch mask on sidewalls of the bottom sacrificial mandrels within the third region of the substrate; and removing the bottom sacrificial mandrels from within the third region of the substrate.

18. The method of claim 1, further comprising removing the bottom sacrificial mandrels from within the first region and second regions of the substrate prior to transferring the pattern corresponding to the bottom etch mask into the substrate.

* * * * *